(12) United States Patent
Jenne et al.

(10) Patent No.: US 7,095,647 B1
(45) Date of Patent: Aug. 22, 2006

(54) MAGNETIC MEMORY ARRAY WITH AN IMPROVED WORLD LINE CONFIGURATION

(75) Inventors: Frederick B. Jenne, Los Gatos, CA (US); Gary A. Gibbs, San Jose, CA (US)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 10/325,008

(22) Filed: Dec. 20, 2002

(51) Int. Cl.
*G11C 11/00* (2006.01)
(52) U.S. Cl. .................. 365/158; 365/145; 365/171
(58) Field of Classification Search ............... 365/158, 365/171, 66, 74, 148
See application file for complete search history.

(56) References Cited

U.S. PATENT DOCUMENTS

| 6,335,890 B1 | 1/2002 | Reohr et al. | |
|---|---|---|---|
| 6,363,007 B1 | 3/2002 | Lu et al. | |
| 6,392,923 B1 * | 5/2002 | Naji | 365/158 |
| 6,512,690 B1 * | 1/2003 | Qi et al. | 365/158 |
| 6,522,575 B1 * | 2/2003 | Inui | 365/158 |
| 6,611,455 B1 * | 8/2003 | Sekiguchi et al. | 365/171 |
| 6,639,831 B1 * | 10/2003 | Pancholy et al. | 365/171 |
| 6,775,182 B1 * | 8/2004 | Boehm et al. | 365/158 |
| 6,829,160 B1 * | 12/2004 | Qi et al. | 365/158 |
| 2003/0117839 A1 * | 6/2003 | Ooishi | 365/171 |

OTHER PUBLICATIONS

Yamada et al., "A Novel Sensing Scheme for a MRAM with a 5% MR Ratio," 2001 Symposium on VLSI Circuits Digest of Technical Papers, 2 pages.
Scheuerlein et al., "A 10ns Read and Write Non-Volatile Memory Array Using a Magnetic Tunnel Junction and FET Switch in each Cell," 2000 IEEE International Solid-State Circuits Conference, 4 pages.

* cited by examiner

*Primary Examiner*—Gene N. Auduong
(74) *Attorney, Agent, or Firm*—Kevin L. Daffer; Mollie E. Lettang; Daffer McDaniel, LLP

(57) ABSTRACT

A magnetic memory array with an improved word line configuration is provided. In some embodiments, the magnetic memory array may be adapted to selectively supply voltage from a single source line to one or more transistors arranged within a first row of the magnetic memory array and to one or more transistors arranged within a second row of the magnetic memory array. In addition or alternatively, the magnetic memory array may be configured to enable current flow along a single current path through a magnetic junction and along multiple paths extending from the single current path to a plurality of transistors. In some embodiments, the plurality of transistors may be formed from a contiguous conductive structure comprising the word line. In some cases, the word line may be configured to include at least two transistors that share a common diffusion region.

18 Claims, 8 Drawing Sheets

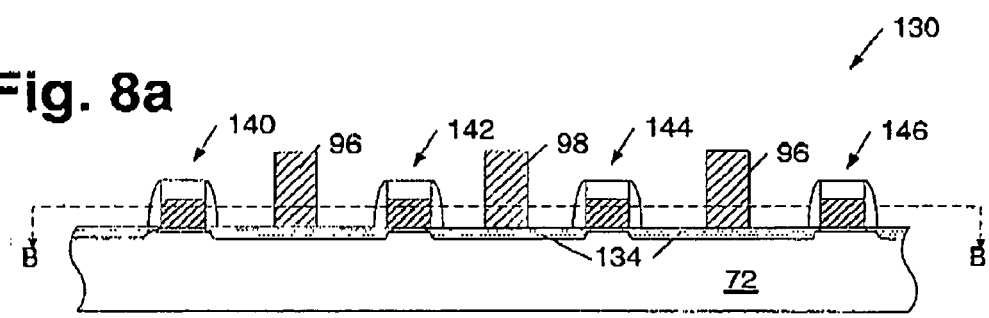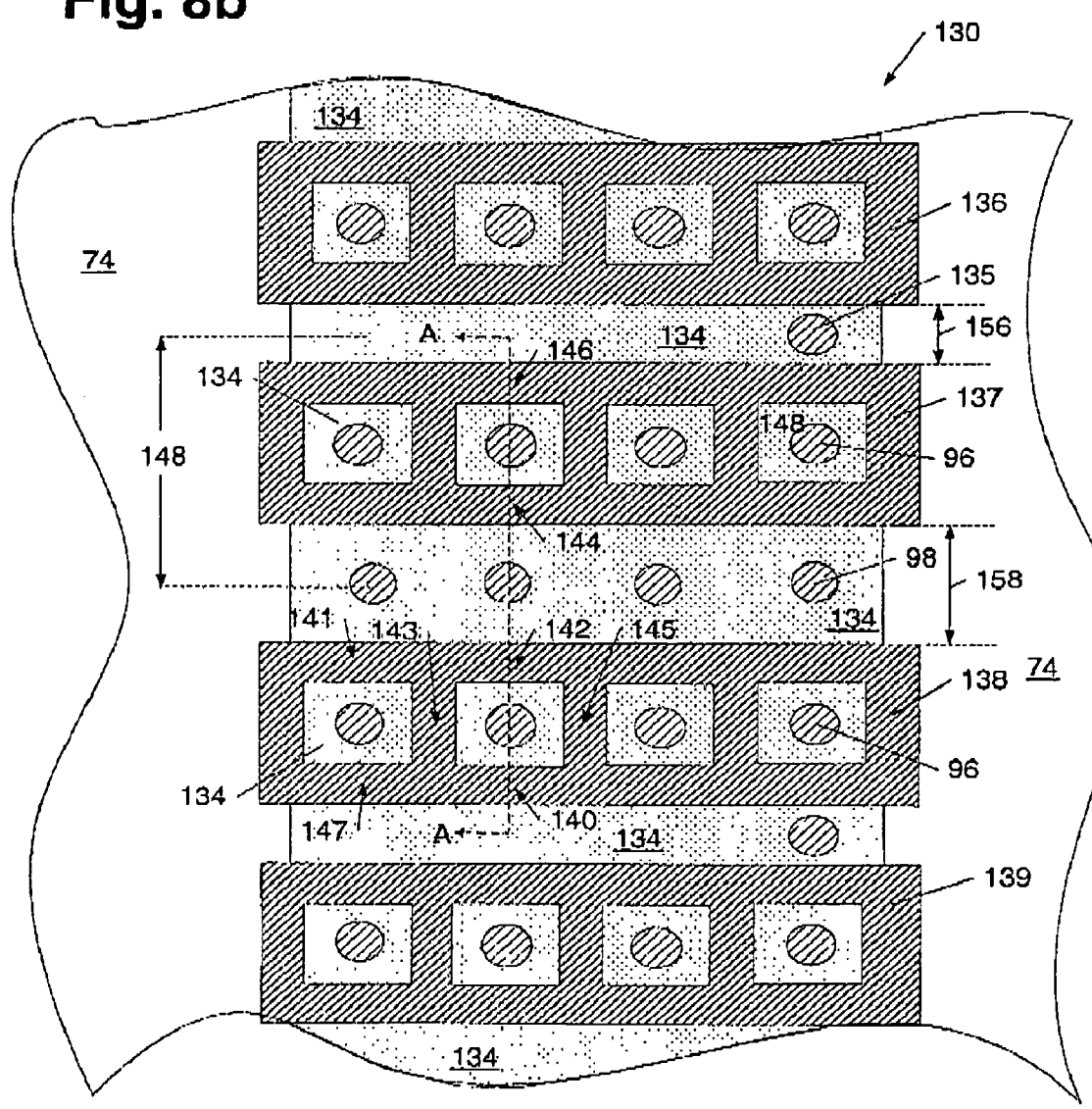

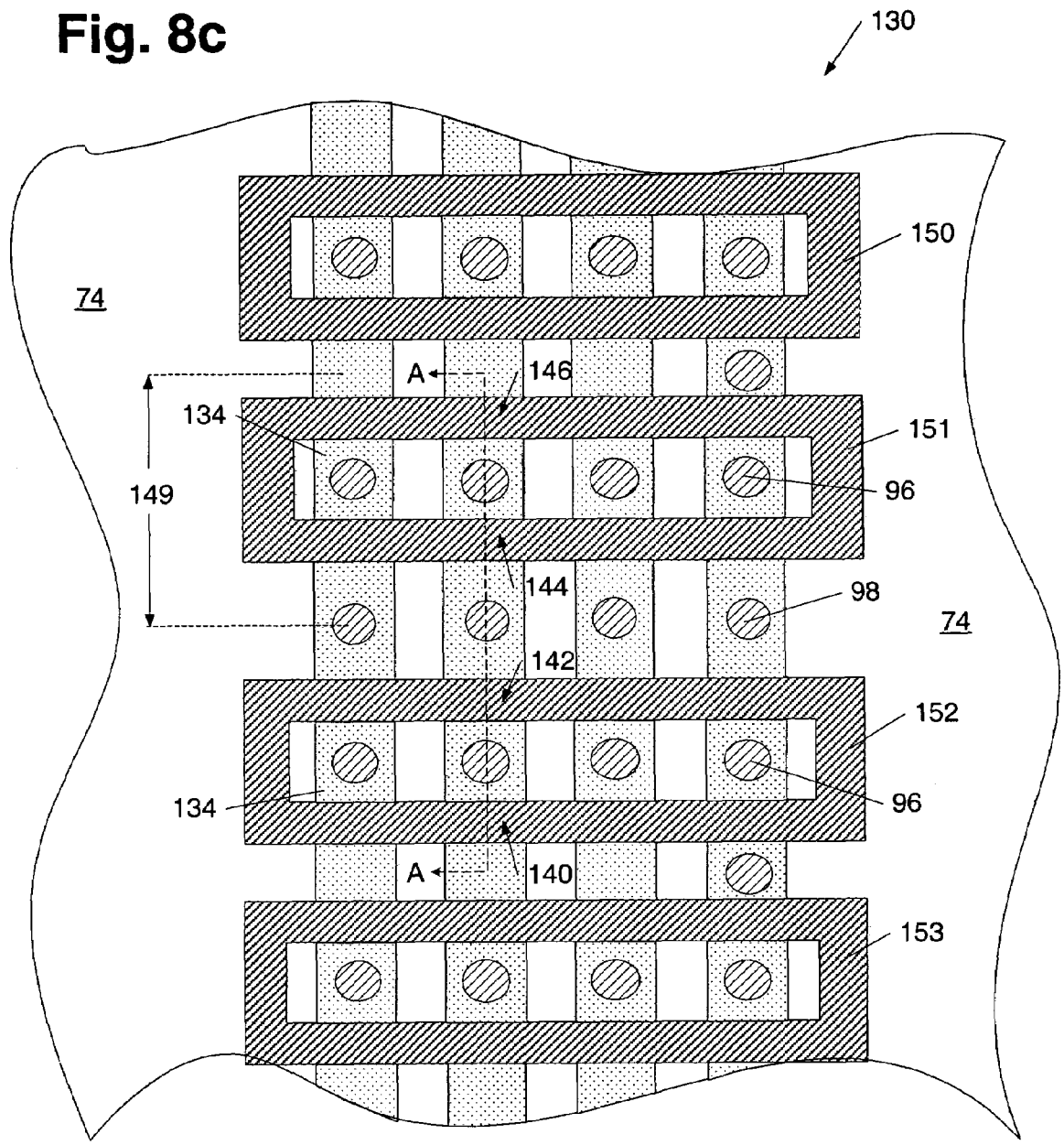

MAGNETIC MEMORY ARRAY WITH AN IMPROVED WORLD LINE CONFIGURATION

BACKGROUND OF THE INVENTION

1. Field of the Invention

This invention relates to magnetic memory arrays and, more particularly, to magnetic memory array configurations.

2. Description of the Related Art

The following descriptions and examples are given as background information only.

Magnetic random access memory (MRAM) devices are non-volatile semiconductor devices which operate through the use of magnetic fields. Typically, an MRAM device includes a plurality of conductive lines with which to generate magnetic fields. The conductive lines may be spaced perpendicular to each other within a plane such that an array of overlap points exists between the lines. An MRAM device may further include a magnetic cell junctions interposed between the conductive lines at such overlap points. In general, the magnetic cell junctions may be adapted to store data information for the device. As such, data may be written to or read from the magnetic cell junctions. In some cases, the conductive lines may be referred to as "bit" and "digit" lines. In general, "bit" lines may refer to conductive lines arranged in contact with magnetic cell junctions that are used for both write and read operations of the magnetic junctions. "Digit" lines, on the other hand, may refer to conductive lines spaced adjacent to the magnetic cell junctions that are used primarily during write operations of the magnetic cell junctions.

During a write operation, current may be applied to a bit line and a digit line corresponding to a particular magnetic junction to create a magnetic field with which to set the magnetic direction of the magnetic cell junction. The set magnetic direction may represent either a "1" or a "0" for the stored data bit. During a read operation, however, magnetic fields are not used to gather the stored information from a magnetic cell junction. Rather, data may be read from a magnetic cell junction by creating a current path from a corresponding bit line through the magnetic cell junction to an underlying transistor such that a resistance measurement may be obtained. The underlying transistor may be turned "on" by the application of voltage along another conductive line of the MRAM device. In some embodiments, the conductive line may be referred to as a "word" line. In general, a word line may include a plurality of transistors respectively coupled to magnetic junctions aligned along a row or column of the array. As such, an MRAM device may also include a plurality of word lines. In addition, an MRAM device may include other lines and structures with which to operate the memory array. For example, an MRAM device may include interconnect lines, isolation regions, contact structures, and ground lines.

Unfortunately, as MRAM device dimensions and spacings therebetween decrease, room for such a plurality of lines and structures becomes increasingly difficult. As such, the presence of such a plurality of lines and structures becomes a limiting factor in the size of a memory array. In addition, the time needed to induce the voltage pulse used to activate the transistors along the word line gradually increases along the line. Such a time delay may be referred as the resistance and capacitance (RC) time constant of a line. In particular, the resistance and, therefore, the capacitance of a conductive line increases along a length of the line, increasing the time needed to induce the voltage pulse used to select the transistors from one end of the line to another. Consequently, as the number of memory cells within an array increases, the amount of time needed to operate all of the devices may need to be longer. Such a reduction in time naturally reduces the operating speed of the array. In some cases, an MRAM array may fail to function properly if too much time is needed to select the transistors.

Furthermore, as the desire for smaller transistors and memory cells continues, the width of transistors continues to decrease. In addition, conventional arrays typically require isolation structures with relatively large widths between memory cells such that adequate isolation may be provided. Such relatively large widths of the isolation structures restrict the width of the transistors. In general, as transistor width decreases, the parasitic resistance of the transistor increases. Consequently, the differential resistance measured during a read operation of an array having transistors with relatively small widths may be lower than an array having transistors with relatively large widths. Such a relatively reduction in differential resistance may inherently reduce the reliability of the device.

In general, a memory cell may include one or more magnetic cell junctions and the circuitry used to read and write from the junctions. As such, in addition to the magnetic cell junctions, a memory cell may include electrodes, underlying transistors, and any contact structures used to electrically connect the components. In addition, a memory cell may further include portions of the bit and digit lines used at the intersection of the magnetic cell junctions. Typically, the logic state of a memory cell may be determined (i.e., read) by comparing it to a cell with a different logic state. As such, in some cases, memory cells may include a pair of magnetic junctions such that a differential signal may be measured between the junctions. Such a configuration may be referred to as a "differential memory cell array." In yet other embodiments, a memory cell may include a single magnetic junction and may be compared to a dummy memory cell which is used for comparing the logic states of all of the memory cells arranged along a particular row or column of the array. Such a configuration may be referred to as a "single memory cell array."

Variations in the transistors of the memory cells, however, may cause disturbances in the measured signals, diminishing the differential resistance between the memory cells. Although the transistors are generally formed from the same fabrication process, they may differ slightly in their construction and/or functional characteristics. For example, transistors formed from the same fabrication process may differ slightly in diffusion depth due to dopant inconsistencies within the semiconductor substrate. In addition or alternatively, transistors may differ slightly in width due to lithographic inconsistencies. Furthermore, variations in capacitance and resistance within the transistors may differ slightly due to variations in threshold voltage, channel length, and/or channel width. In some embodiments, such variations may be caused by misalignment of the layers within the transistor. In any case, variations within the transistors may lead to parasitic resistances, which may diminish the differential signal between the memory cells. As a result, the parasitic resistance of a transistor may make the state of the corresponding programmed memory cell more difficult to determine.

Therefore, it would be advantageous to develop an MRAM array which generates a relatively small amount of parasitic resistance during a read operation of the array. In particular, it would beneficial to develop an MRAM array with lower transistor parasitic resistance than a conventional MRAM array. In addition, it would be advantageous to fabricate an MRAM array with a word line having a lower RC time constant than those of conventional arrays. Moreover, it would be advantageous to produce an MRAM array with transistors having larger widths than conventional arrays without increasing the size of the memory cells within the array.

SUMMARY OF THE INVENTION

The problems outlined above may be in large part addressed by a magnetic memory array circuit with an improved word line configuration. In some embodiments, the magnetic memory array circuit may be adapted to selectively supply voltage from a single source line to gates of one or more transistors arranged within a first row of a magnetic memory array and to gates of one or more transistors arranged within a second row of the magnetic memory array. In addition or alternatively, the magnetic memory array circuit may be configured to enable current flow along a single current path through a magnetic junction and along multiple paths extending from the single current path to a plurality of transistors. In some embodiments, the plurality of transistors may be formed from a contiguous conductive structure comprising the word line. In some cases, the word line may be configured to include at least two transistors that share a common diffusion region.

As stated above, in some embodiments, the magnetic memory array circuit described herein may be adapted to selectively supply voltage from a single source line to gates of one or more transistors arranged within a first row of a magnetic memory array and to gates of one or more transistors arranged within a second row of the magnetic memory array. In some cases, the magnetic memory array circuit may be further adapted to selectively supply voltage from the single source line to gates of one or more transistors arranged within other rows of the magnetic memory array. In yet other embodiments, the single source line may be one of a plurality of source lines separately arranged between every other row within the magnetic memory array.

In either embodiment, the magnetic memory array circuit may further include a first selection device adapted to direct the voltage from the single source line to the gates of the one or more transistors within the first row and a second selection device adapted to direct the voltage from the single source line to the gates of the one or more transistors within the second row. In addition, the magnetic memory array may include a control line adapted to selectively activate the first selection device and the second selection device. In some cases, the control line may be further adapted to selectively activate a third selection device of the magnetic memory array to direct another voltage from a different source line to gates of one or more transistors arranged within a third row of the magnetic memory array. In some embodiments, the one or more transistors within the first row may include a portion of a plurality of transistors arranged along the first row. In such an embodiment, the magnetic memory array may further include a second control line adapted to activate a fourth selection device of the magnetic memory array to direct voltage from the single source line to gates of one or more transistors within another portion of the plurality of transistors arranged along the first row.

In addition or alternatively, the magnetic memory array described herein may include a word line having a first transistor and a second transistor that share a common diffusion region. In some cases, the word line may include one or more additional transistors that share the common diffusion region. In any case, the first transistor may be laterally spaced from the second transistor by the common diffusion region in some embodiments. In this manner, the first and second transistors may be arranged such that their widths are aligned along the same direction of the magnetic memory array. In yet other embodiments, the first and second transistors may be arranged such that their widths are aligned along different directions of the magnetic memory array. In such a case, the word line may further include a third transistor laterally spaced from the first transistor by a length of the second transistor.

In some cases, the second transistor may be configured to isolate the first and third transistors from each other. Consequently, the second transistor may be referred to as an "isolation transistor" in some embodiments. Such a configuration may be particularly advantageous in an embodiment in which the first and third transistors are respectively arranged within single memory cells such that the second transistor may serve to isolate the memory cells. In yet other embodiments, the second transistor may be configured to reduce the parasitic resistance variation between the first and third transistors. More specifically, the second transistor may be configured to substantially equalize the parasitic resistance variation between the first and third transistors. Hence, the second transistor may be referred to as an "equilibrium transistor" in some embodiments. In any case, such a configuration may be particularly useful in an embodiment in which the first and second transistors are arranged within a differential memory cell. In such an embodiment, the word line may further include a fourth transistor with which to isolate the differential memory cell from another memory cell of the array.

There may be several advantages to fabricating a magnetic memory array including the word line configuration described herein. In particular, the memory circuit described herein may include a source line with a relatively low RC time constant with which to supply word lines along rows of the memory array. Such a line with a relatively low RC time constant may increase the operating speed of the memory array. In addition, the source line may be adapted to selectively supply voltage to select sets of transistors along a row of a memory array. Such a configuration may include a plurality of word lines along a row of the memory array, preferably having smaller lengths than word lines of conventional memory arrays. In this manner, the RC time constant of the word lines may be reduced, further increasing the operating speed of the memory array.

Furthermore, in some embodiments, the magnetic memory array described herein may reduce the parasitic resistance variation between differential memory cells such that a greater differential resistance may be measured between the cells. In this manner, the state of the cell may be more easily determined than as compared to differential cells in which the parasitic resistance variation is not reduced. In addition or alternatively, the manner in which memory cells are isolated from each other in the magnetic memory array described herein may be advantageous. In particular, the isolation technique described herein allows transistors to have greater widths than transistors in conventional devices without sacrificing the number of the cells arranged within an array. Such a greater transistor width reduces the parasitic resistance of the transistor, increasing the differential resistance measurement of the memory cell including the transistor. In other cases, the isolation technique described herein may allow more memory cells to be fabricated along a direction of a memory array, increasing the density of the memory array. In particular, such a magnetic memory array may include more memory cells than a conventional magnetic memory array and therefore, may offer a device within increased memory capacity.

BRIEF DESCRIPTION OF THE DRAWINGS

Other objects and advantages of the invention will become apparent upon reading the following detailed description and upon reference to the accompanying drawings in which:

FIG. 4b depicts a top view of the semiconductor topography depicted in FIG. 4a;

FIG. 5b depicts a top view of the semiconductor topography depicted in FIG. 4a;

FIG. 6a depicts a partial cross-sectional view of the semiconductor topography in which additional structures have been formed subsequent to the formation of the gate structures in FIG. 5a;

FIG. 7 depicts a partial cross-sectional view of the semiconductor topography in which more layers and structures have been formed subsequent to the formation of the additional structures in FIG. 6a;

FIG. 8a depicts a partial cross-sectional view of a semiconductor topography, in an alternative embodiment, in which transistors have been formed upon a semiconductor substrate;

FIG. 8b depicts a top view of the semiconductor topography depicted in FIG. 8a taken along line BB;

FIG. 8c depicts a top view of the semiconductor topography depicted in FIG. 6a taken along line BB in an alternative embodiment.

Figure 1:
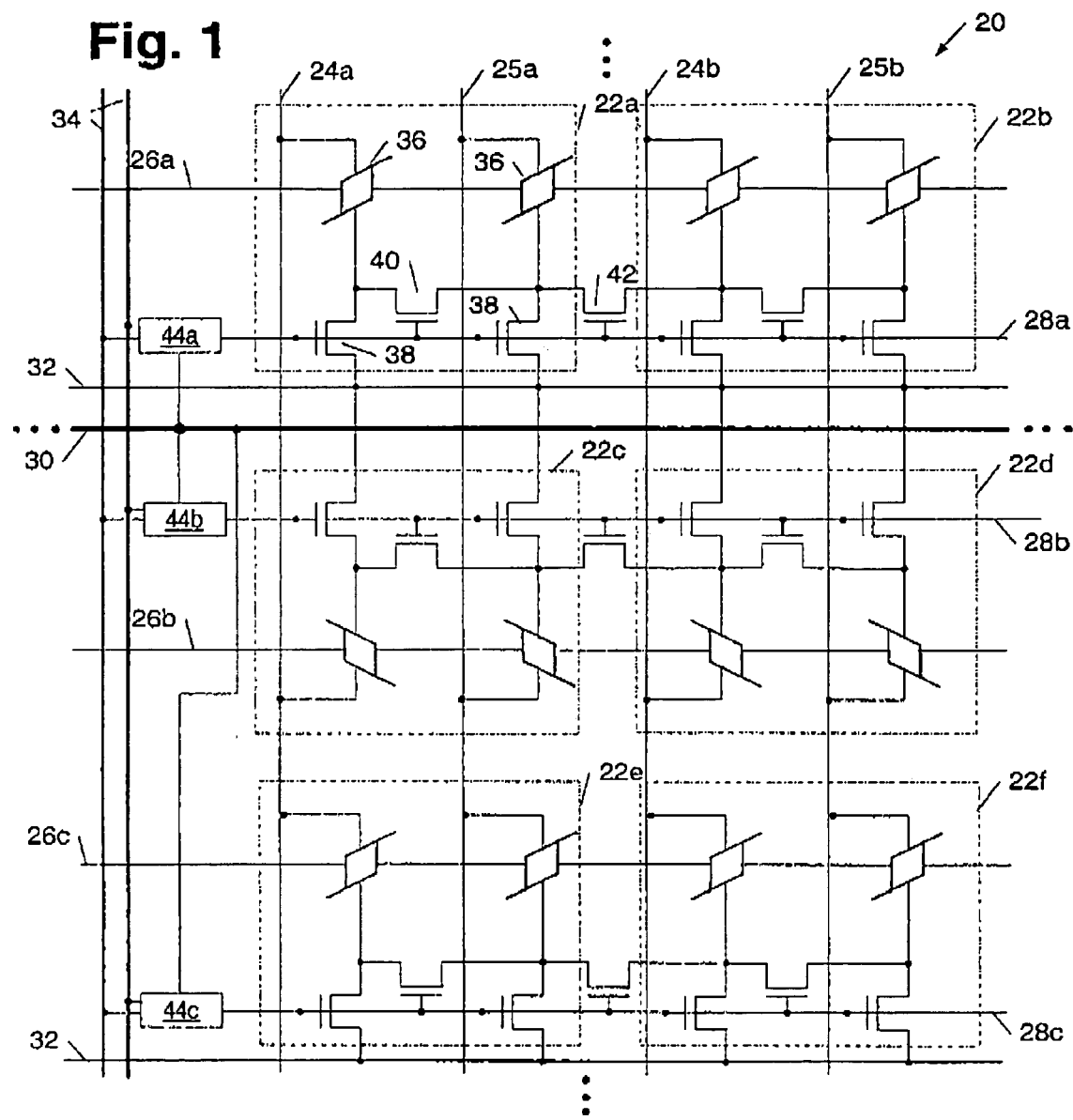
FIG. 1 depicts an electrical schematic diagram of a magnetic memory cell array.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, exemplary embodiments of circuits including magnetic memory cell arrays are provided. In addition, exemplary embodiments of a method for fabricating such circuits are provided. FIG. 1 depicts a partial electrical schematic diagram of circuit 20 including magnetic memory cells 22a–22f arranged in an array of rows and columns. Although circuit 20 only illustrates an array with three rows and two columns of magnetic memory cells, any number of memory cells may be included in circuit 20, depending on the size of the circuit components and the substrate on which they are formed. As such, circuit 20 may include any number of rows and/or columns as indicated by the continuation dots arranged along the periphery of circuit 20. In addition, circuit 20 may include a plurality of conductive lines associated and aligned along each row and column of the magnetic memory cell array. In particular, circuit 20 may include bit lines 24a and 24b and bit line bars 25a, and 25b arranged along each of the columns of the magnetic memory array arranged within circuit 20. Moreover, circuit 20 may include digit lines 26a–26c and word lines 28a–28c arranged along rows of the magnetic memory array arranged within circuit 20. Furthermore, circuit 20 may include source line 30 and ground lines 32 interposed between the rows of the magnetic memory array. In addition, circuit 20 may include control lines 34 arranged in alignment with the array columns.

It is noted that the orientation of a line with respect a "row" or a "column" of an array may be reversed. In particular, the description of conductive lines 24a, 24b, 25a, 25b, 26a–26c, 28a–28c, 30, and 32 with regard to the rows and columns of the memory array in circuit 20 may be changed such that the lines are aligned along opposite dimensions of the array, respectively. More specifically, the orientation of the array described herein to have rows and columns may depend on the perspective used to describe the array. In this manner, the characterization of rows and columns to describe the arrangement of structures and layers within an array may be interchanged depending on the viewpoint used to describe the array. Consequently, the use of the rows and columns to describe the relative arrangement of lines within the memory array described herein does not restrict such lines to be arranged along the opposite dimensions of the array.

The periphery of each magnetic memory cells 22a–22f is outlined in FIG. 1, indicating that each of the memory cells include the plurality of components contained within their dotted lines. It is noted that the dotted lines are merely illustrated to distinguish the arrangement of memory cells 22a–22f within the array and to describe components of the memory cells. Therefore, the dotted lines outlining the periphery of the magnetic cells are not included within the circuit and do not serve a function for the circuit. In addition, the placement of the dotted-line boundary is arbitrary and therefore, the size of the memory cell is not restricted to the dotted line itself. For example, magnetic memory cells 22a–22f in FIG. 1 are illustrated including a differential pair of memory cells. However, in other embodiments, the dotted line may be arranged around a single magnetic junction and components used to write to and read from the magnetic junction to define the boundary of a single memory cell. In such an embodiment, memory circuit 20 may include a dummy cell arranged along one or more rows of the array. Such a dummy cell may be programmed in a logic state different than those expected for a selected memory cell. In this manner, a differential resistance measurement may be obtained between the selected cell and the dummy cell. As such, the configuration of the memory circuit described herein may be included in differential memory cell arrays and single cell memory arrays. Furthermore, each of the memory cells of circuit 20, including memory cells 22a–22f and all other memory cells contained within the array, may include substantially similar components. Therefore, the description of the memory cell components as described below may pertain to each of the memory cells of the array.

FIG. 1 illustrates magnetic memory cell 22a including a pair of magnetic cell junctions 36 coupled to bit line 24a and bit line bar 25a, respectively. In some embodiments, reference of "bit line" and "bit line bar" may be reversed with respect to reference numbers 24a and 25a. In either case, the function of bit line 24a and bit line bar 25a may be substantially similar in that they may supply current with which to either write or read data to and from magnetic cell junctions arranged along the column of the memory array in which the conductive lines reside. More specifically, bit line 24a and bit line bar 25a may be used to write opposite bit information to the magnetic cell junctions to which they are respectively coupled such that a differential resistance may be measured between the junctions. In particular, the bit line may be used to write data to one of magnetic cell junctions 36, while the bit line bar may be used to write an opposite bit of information in the other of magnetic cell junctions 36. As shown in FIG. 1, magnetic memory cell 22a may further include digit line 26a arranged adjacent to magnetic cell junctions 36. Similar to the function of bit line and bit line bars, a digit line may be used to write information to magnetic cell junctions 36 as described in more detail below. Moreover, FIG. 1 illustrates magnetic cell junctions 36 coupled to a respective pair of select transistors 38, which are further coupled to word line 28a. The function of such a word line is described in below with reference to the read operation of the memory cell.

In general, magnetic cell junctions 36 may be used to store data. In this manner, data may be read from and/or written to magnetic cell junctions 36. The writing operation of memory cells 22a may be conducted by setting the magnetic direction of magnetic cell junctions 36. In particular, magnetic cell junctions 36 may be written by a magnetic field induced by the application of current along conductive lines 24a, 25a, and/or 26a. The direction of such an induced magnetic field may set the magnetic direction of magnetic cells junctions 36. The reading operation, however, does not use the application of a magnetic field. Instead, the reading operation may be conducted by turning transistors 38 "on" such that current may flow from bit line 24a and bit line bar 25a through magnetic cell junctions 36 to ground line 32. Since transistors 38 may be specifically used for selecting one or more magnetic junctions among a plurality of junctions for the read operation of the device, transistors 38 may sometimes be referred as "select transistors." Turning select transistors 38 "on" may be conducted by applying a voltage pulse along word line 28a. In some cases, the voltage applied to word line 28a may be supplied from source line 30. Such a process is described in more detail below with reference to the description of source line 30.

Allowing current to flow from bit line 24a and bit line bar 25a through magnetic cell junctions 36 may allow the stored data in each junction to be read. In particular, the magnetic direction of magnetic cell junctions 36 may be read by measuring the resistance through each of the conductive paths associated with the junctions. In cases in which two magnetic cell junctions are contained within a memory cell as shown in FIG. 1, the differential resistance between magnetic junctions 36 may be used to determine the stored bit value of memory cell 22a. Consequently, both select transistors 38 may be turned "on" to read from magnetic junctions 36 in such a case. Yet, in an embodiment in which magnetic cell junctions 36 are each contained within their own respective memory cells, one of select transistors 38 may be activated while another select transistor corresponding to a dummy cell arranged within the row or column of the selected cell is also activated.

In some embodiments, memory cell 22a may further include transistor 40 coupled between select transistors 38 as shown in FIG. 1. In cases in which magnetic cell junctions 36 are contained within a differential memory cell, transistor 40 may serve to reduce the parasitic resistance variations between select transistors 38. More specifically, select transistors 38 may vary slightly from each other causing a variation in parasitic resistance between the transistors. Although select transistors 38 are generally formed from the same fabrication process, they may differ slightly in their construction and/or functional characteristics. For example, select transistors 38 may differ slightly in diffusion depth due to dopant inconsistencies within the semiconductor substrate. In addition or alternatively, select transistors 38 may differ slightly in diffusion width due to lithographic inconsistencies. Furthermore, select transistors 38 may include variations in capacitance and resistance within the transistors due to slight variations in threshold voltage, channel length, and/or channel width. In some cases, such slight variations may be caused by misalignment of the layers with one or both of the transistors.

In any case, the parasitic resistances between the transistors may diminish the differential signal between the magnetic cell junctions. As a result, the logic state of the programmed memory cell may be more difficult to determine. Transistor 40 may be coupled between select transistors 38 to reduce the effect of variations between select transistors 38. In this manner, the operation of transistor 40 may be distinct from the operation of select transistors 38 and, therefore, may sometimes be referred as an "auxiliary transistor" of the device. In some cases, transistor 40 may equalize the current distributed to select transistors 38 such that each of the transistors voltage measurements may more accurately represent the resistance of the magnetic direction stored within magnetic cell junctions 36. As such, transistor 40 may be referred to as an "equalizing transistor" in some embodiments. In other embodiments, equalizing transistor 40 may be omitted from circuit 20 and/or serve as an isolation transistor as explained in more detail below in reference to transistor 42.

As shown in FIG. 1, circuit 20 may further include transistor 42 interposed between memory cells 22a and 22b. Such a transistor may serve to isolate memory cells 22a and 22b from each other and, therefore, may be referred to as an "isolation transistor." In addition or alternatively, transistor 42 may be referred to as an "auxiliary transistor," since it is used enhance the read operation of the device. In some embodiments, circuit 20 may include isolation transistors arranged along both sides of memory cells 22a–22f. In yet other embodiments, transistor 42 may be omitted from circuit 20. In such an embodiment, the memory cells of circuit 20 may be laterally isolated by conventional isolation structures, such as shallow trench isolation regions or structures fabricated from local oxidation of silicon (LOCOS). In yet other embodiments, the memory cells of circuit 20 may be laterally isolated using a combination of isolation transistors and conventional isolation structures dispersed throughout the array.

In addition to isolating memory cells 22a and 22b, transistor 42 may also offer a manner in which to increase the differential resistance measured for a memory cell as compared to conventional memory cells. In general, conventional isolation structures are fabricated with relatively large widths such that adequate isolation may be provided between memory cells. Consequently, the widths of select transistors in conventional circuits are often reduced in order to maximize the density of a magnetic memory array. Such a reduction in widths of the select transistors may undesirably increase the parasitic resistance of the transistors. Transistor 42, however, may be fabricated having a narrower width than conventional isolation structures. Consequently, select transistors 38 may be fabricated with substantially greater widths than select transistors within conventional magnetic memory array circuits. In this manner, the parasitic resistance of select transistors 38 may be lower, thereby providing a larger signal by which the bit stored within magnetic cell junctions 36 may be determined.

In addition, transistor 42 may add resistance in parallel to the resistance of select transistors 38. As is well known in the fabrication of circuits, a circuit having resistors arranged in parallel results in the distribution of the resistance, lowering the overall resistance of the circuit. Consequently, the inclusion of transistor 42 may lower the parasitic resistance of a memory cell. Similarly, transistor 40 may add resistance in parallel with the resistance of select transistors 38. In this manner, transistor 40 may additionally or alternatively lower the parasitic resistance of a memory cell. In some embodiments circuit 20 may include transistors other than transistor 40 and 42 arranged in parallel with select transistors 38, such that the parasitic resistance of memory cell 22a may be further reduced. An exemplary embodiment illustrating such a configuration is described in more detail below in reference to FIGS. 8a–9.

Figure 2:
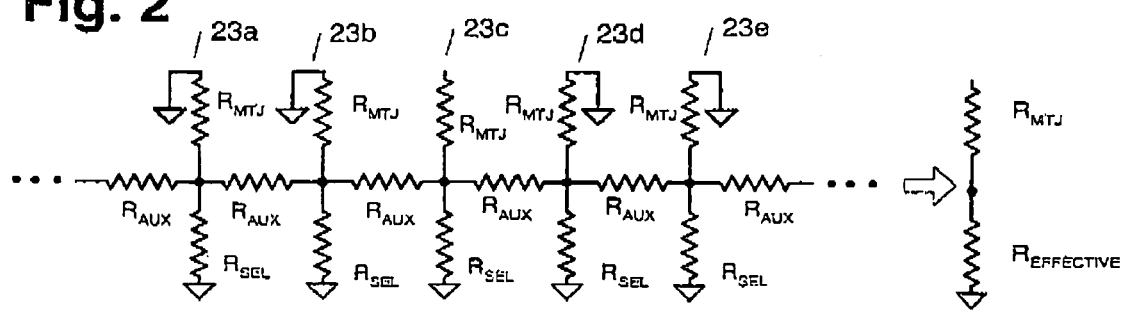
FIG. 2 depicts a schematic diagram outlining the resistance within a between memory cells arranged along a row of a memory cell array.

An exemplary schematic diagram detailing the resistance within and between memory cells along a row of a memory array described herein is illustrated in FIG. 2. In particular, FIG. 2 illustrates the resistance of the magnetic cell junctions of the magnetic memory array as $R_{MTJ}$, the resistance of the select transistors of the memory array as $R_{SEL}$, and the resistance of the auxiliary transistors of the memory array as $R_{AUX}$. In addition, FIG. 2 illustrates the selection of memory cell 23c from memory cells 23a–23e along a row of the memory array. In particular, FIG. 2 illustrates a schematic of a memory array which is configured to enable current flow along a single current path through a magnetic junction and along multiple current paths between the magnetic junction and a plurality of transistors coupled to the magnetic junction. For example, the selection of memory cell 23c enables current flow through the magnetic junction of the memory cell represented by $R_{MTJ}$, to a plurality of transistors represented by $R_{AUX}$ and $R_{SEL}$. In general, additional memory cells may be connected in series with memory cells 23a–23e as indicated by the continuation dots included in FIG. 2. In addition, the diagram used in FIG. 2 to describe the reduction of parasitic resistance within the memory array provided herein may include either single cell memory cell arrays or differential memory cell arrays. As such, the description of the reduction of parasitic resistance within the memory array provided herein is not restricted to single memory cell arrangement of memory cells 23a–23c depicted in FIG. 2.

As noted above, the auxiliary transistors may serve to reduce the parasitic resistance variation between select transistors and/or may serve to isolate the select transistors within a selected memory cell. In any case, the inclusion of such transistors may reduce the parasitic resistance of the memory cells, such that the overall effective resistance of a selected memory cell within the memory array is reduced relative to selected memory cells of conventional memory arrays which do not include auxiliary transistors. Such an overall effective resistance is illustrated in FIG. 2 as $R_{EFFECTIVE}$, denoting the net resistance within a selected memory cell of the memory array. In some cases, the parasitic resistance of a selected memory cell (i.e., $R_{EFFECTIVE}$) may be reduced by up to 75% as compared to memory cells of conventional magnetic memory arrays.

In general, an isolation transistor may be referred to as a transistor interposed between a select transistor of one memory cell and a select transistor of an adjacent memory cell. On the contrary, an equalizing transistor may refer to a transistor interposed between select transistors of one memory cell. As such and as noted above, transistor 40 may serve as an isolation transistor in some embodiments. In particular, transistor 40 may serve as an isolation transistor in embodiments in which memory cells 22a–22f comprise a single memory cell array. In such an embodiment, circuit 20 may not include differential memory cells and, therefore, may not be affected by variations in parasitic resistances between transistors of adjacent memory cells. As such, an equalizing transistor may not be needed in a single memory cell array configuration. In addition to isolating transistors in such an embodiment, transistor 40 may further reduce the parasitic resistance of the memory cells since transistor 40 adds a resistor in parallel 10 select transistors 38. As such, in some embodiments, the inclusion of transistor 40 may increase the operating speed of a memory array relative to memory arrays that do not include isolation transistors.

As noted above, circuit 20 may include word lines 28a–28c with which to supply a voltage pulse to select transistors 38 within respective rows of the array. In addition, circuit 20 may include source line 30 adapted to selectively supply voltage to word lines 28a–28c. In this manner, source line 30 may be "shared" between multiple rows of transistors. As a result, a single source of voltage may be used to activate select transistors 38 within multiple rows of the memory array. In general, source line 30 may include a conductive material such that an electrical connection may be made to the structures to which it is coupled. For example, source line 30 may include aluminum, copper, doped polysilicon, titanium, tungsten, or any alloys thereof. In a preferred embodiment, source line 30 may be made of a material having a relatively low resistivity. More specifically, source line 30 may be made of a material having a lower resistivity than doped polysilicon, which is typically used for word lines of a memory array. For instance, source line 30 may preferably include aluminum or copper. A material having relatively low resistivity allows source line 30 to have a relatively low RC time constant, optimizing the operating speed of the memory array described herein. The thickness of source line 30 may also be optimized to allow the line to have a relatively low RC time constant as well or alternatively. For example, the thickness of source line 30 may be between approximately 500 angstroms and approximately 2000 angstroms. Larger or smaller thicknesses of source line 30 may be appropriate, however, depending on the design specifications of the array.

As illustrated in FIG. 1, source line 30 may be coupled to word lines 28a–28c by selection devices 44a–44c. Selection devices 44a–44c may include any device known in the microelectronics industry for selectively transferring a voltage pulse from one conductive line to another conductive line. For example, selection devices 44a–44c may include switches, mutiplexors, or flip-flops. Circuit 20 may further include control lines 34 with which to select one of selection devices 44a–44c such that current may be supplied from source line 30. In some embodiments, control lines 34 may be adapted to selectively activate additional selection devices contained within circuit 20. In particular, control lines 34 may be adapted to selectively activate selection devices arranged within rows of the memory array not shown in FIG. 1. Although two control lines are shown coupled to selection devices 44a–44c in FIG. 1, any number of control lines may be adapted to activate the selection devices, depending on the design specifications of the device. For example, a single control line may be used to activate one of two selection devices of the circuit, in some embodiments. Alternatively, more than two control lines may be used to activate selection devices of the circuit.

Figure 3:
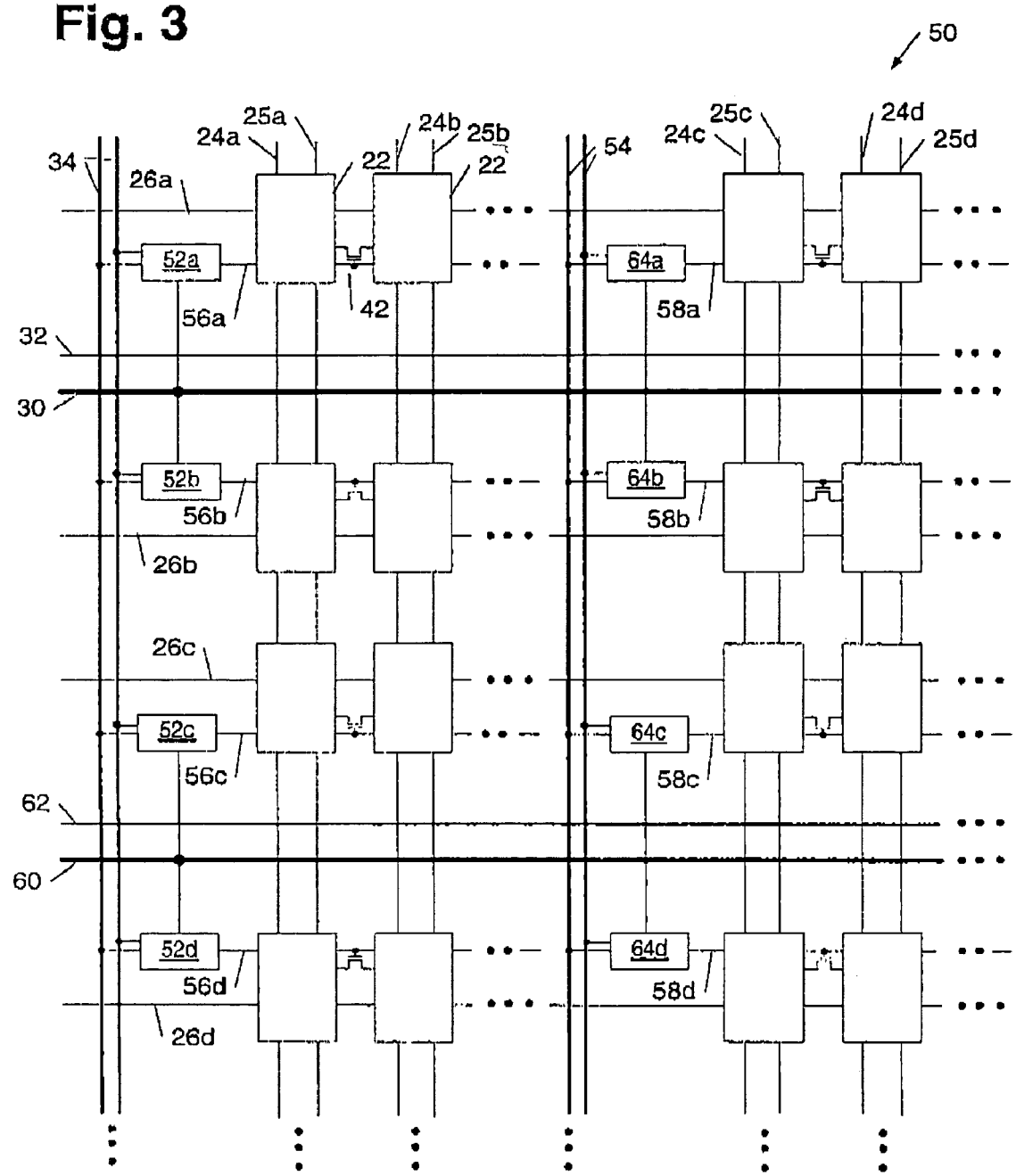
FIG. 3 depicts an alternative electrical schematic diagram of a magnetic memory cell array.

In some embodiments, circuit 20 may be adapted to selectively supply voltage to a plurality of rows within the array. For example, in some embodiments, circuit 20 may be adapted to selectively supply voltage to gates of one or more transistors arranged within a first row of the magnetic memory array and to gates of one or more transistors arranged within a second row of the magnetic memory array. In such an embodiment, conductive line 32 may be one of a plurality of conductive lines separately arranged between every other row of the magnetic memory array. Such an embodiment is shown in FIG. 3 and is described in more detail below. In other embodiments and as shown in FIG. 1, circuit 20 may be adapted to selectively supply voltage to gates of one or more transistors arranged within more than two rows of the magnetic memory array. In particular, FIG. 1 shows source line 30 coupled to memory cells 22a–22f through selection devices 44a–44c. In some cases, circuit 20 may be further adapted to supply voltage from conductive line 30 to rows of memory cells than that are not shown in FIG. 1. For example, circuit 20 may be adapted to supply voltage to gates of select transistors within each row of the array in some embodiments. Alternatively, circuit 20 may be adapted to supply voltage to less than all of the rows of memory cells.

In addition, circuit 20 may be adapted to selectively supply voltage from source line 30 to gates of all of the transistors within a row of the array. In particular, word lines 28a may be arranged within circuit 20 such that the line extends through every memory cell within a row of the array. In such an embodiment, circuit 20 may include a single word line for each row of the array. In other embodiments, circuit 20 may include a plurality of word lines for each row of the array. In such a case, each of the plurality of word lines may couple to a portion of the plurality of transistors arranged within a row of the array. More specifically, each of the plurality of word lines may couple to a fewer number of transistors than exist along a row of the array. A circuit including such a configuration is shown in FIG. 3 and described below. In general, such an embodiment may be advantageous, since voltage may be applied through only a portion of the plurality of transistors during a given operation, preventing a relatively large RC time constant to develop along the word line. In addition, source line 30, in such an embodiment, may be coupled to each of the plurality of word lines such that source line 30 may selectively supply voltage to gates of all of the transistors within a row of the array. In this manner, source line 30 may still serve as a single source line of voltage.

FIG. 3 illustrates another embodiment of a magnetic memory array circuit including a different electrical schematic configuration. As shown in FIG. 3, circuit 50 may include an array of memory cells 22 arranged in a plurality of rows and columns. As shown by the continuation dots along the periphery of circuit 50, circuit 50 may further include additional rows and columns of memory cells 22 as well. Memory cells 22 may be substantially similar to memory cells 22 of FIG. 1. More specifically, memory cells 22 may include one or more magnetic junctions, select transistors, and conductive structures such that the components may be electrically connected to each other. Such components of memory cells 22, however, are not shown in FIG. 3 to simplify the illustration. Consequently, in some embodiments, memory cells 22 in FIG. 3 may include differential memory cells or single memory cells.

In some cases, memory cells 22 may further include an equalizing transistor between select transistors of the memory cells. Alternatively, memory cells 22 may be absent of such an equalizing transistor. In either embodiment, circuit 50 may further include an isolation transistor between each memory cell as described above in reference to FIG. 1 and as shown by transistor 42. In yet other embodiments, circuit 50 may not include an isolation transistor between each memory cell. In particular, circuit 50 may be absent of isolation transistors in some embodiments and may alternatively include conventional field oxide isolation structures as described above. In addition, circuit 50 may further include conductive lines 24a–24d, 25a–25d, 26a–26d, 30, and 32. Such lines may be substantially similar to conductive lines 24a, 24b, 25a, 25b, 26a–26c, 30, and 32 in FIG. 1. As such, conductive lines 24a–24d and 25a–25d may be bit lines and bit line bars. In addition, conductive lines 26a–26d may be digit lines. In addition, source line 30 maybe used to selectively supply voltage to gates of transistors arranged within a plurality of rows of the memory array.

In contrast to circuit 20 of FIG. 1, circuit 50 may include word lines 56a–56d and 58a–58d arranged within rows of the magnetic memory array. More specifically, each row of the magnetic memory array may include a plurality of word lines arranged in series along the row. For example, one row of circuit 50 may include word line 56a and word line 58a, as shown in FIG. 3. Although FIG. 3 only illustrates two different word lines arranged in series along a row of the array, circuit 50 may include any number of word lines arranged in series with word lines 56a–56d and 58a–58d. In any case, each of the word lines may supply voltage to a portion of the plurality of memory cells within a row of the array. In particular, word lines 56a–56d and 58a–58d only traverse a portion of the transistors within the array row. In this manner, the length of word lines 56a–56d and 58a–58d will be restricted, resulting in a relatively low RC time constant along the word lines. Accordingly, the operating speed of an array including multiple word lines along a row of the array may be faster than that of an array with a single word line configuration.

In some cases, source line 30 may be coupled to word lines 56a–56d and 58a–58d such that voltage may be selectively supplied between the lines. In this manner, a single voltage source line may be used to supply voltage to conductive lines 56a–56d and 58a–58d. Alternatively, circuit 50 may include additional source line 60 with which to supply voltage to one or more of word lines 56a–56d and 58a–58d. For example, source line 60 may be adapted to supply voltage to the word lines 56c and 58c arranged in the row above source line 60 as shown in FIG. 3. In addition, source line 60 may be adapted to supply voltage to the word lines 56d and 58d arranged in the row below source line 60. As shown in FIG. 3, source line 30 may be adapted supply voltage to words lines 56a, 58a, 56b, and 58b respectively arranged above and below source line 30 in such an embodiment. In some cases, source lines 30 and 60 may be two of a plurality of source lines within circuit 50 which are arranged between every other row of the array. In this manner, circuit 50 may include half the number of source lines as the number of rows within the array. Such an embodiment may be advantageous for optimizing dimensional limitations of the device. In other embodiments, however, the number of source lines in circuit 50 may be fewer than half the number of rows within the array. In yet other embodiments, the number of source lines in circuit 50 may be more than half the number of rows within the array. In any embodiment, the arrangement of such a plurality of source lines may depend on the design specifications of the device.

In general, source lines 30 and 60 may be adapted to supply voltage to word lines 56a–56d and 58a–58d through selection devices 52a–52d and 64a–64d. Selection devices 52a–52d and 64a–64d may be similar to selection devices 44a–44c of FIG. 1. In particular, selection devices 52a–52d and 64a–64d may include any device known in the microelectronics industry for selectively transferring a voltage pulse from one conductive line to another conductive line. For example, selection devices 52a–52d and 64a–64d may include switches, mutiplexers, or flip-flops. Circuit 50 may further include control lines 34 and 54 with which to activate one of selection devices 52a–52d and 64a–64d such that voltage may be supplied from source line 30 or 60 to word lines 56a–56d and 64a–64d, respectively. In general, control lines 34 and 54 may be similar to control lines 34 of FIG. 1. As such, control lines 34 and 54 may be adapted to selectively activate additional selection devices contained within circuit 50. In particular, control lines 34 and 54 may be adapted to selectively activate selection devices arranged within rows of the memory array not shown in FIG. 3.

Figure 4A:
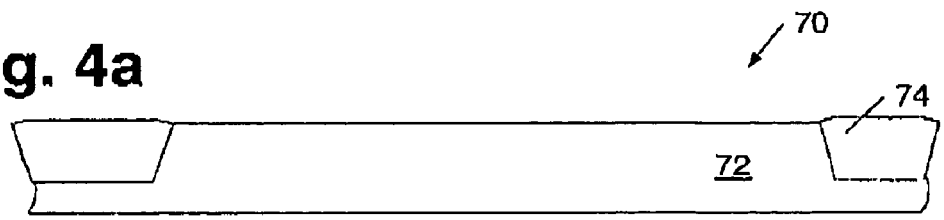
FIG. 4a depicts a partial cross-sectional view of a semiconductor topography which includes isolation regions within a semiconductor substrate.

Exemplary methods for fabricating a circuit with the configurations described herein are described in reference to FIGS. 4a–8c. In particular, one exemplary method for processing a semiconductor topography is described in reference to FIGS. 4a–7, which results in a topography having a plan view as depicted in FIG. 6b. Alternative methods are described in reference to FIG. 8a, which result in topographies having plan views as depicted in FIGS. 7b and 7c. Turning to FIGS. 4a and 4b, a partial view of semiconductor topography 70 is shown including isolation region 74 formed within portions of semiconductor substrate 72. In particular, FIG. 4a illustrates a partial cross-sectional view of semiconductor topography 70 taken along line AA of the partial top view of semiconductor topography 70 in FIG. 4b. Likewise, FIGS. 5a and 6a illustrate a partial cross-sectional view of semiconductor topography 70 taken along line AA of the partial top-views of semiconductor topography 70 in FIGS. 5b and 6b, respectively.

Semiconductor substrate 72 may be a silicon substrate and may, in some embodiments, be doped either n-type and/or p-type. For example, semiconductor substrate 72 may be a monocrystalline silicon, gallium-arsenic, indium phosphide, silicon-germanium, silicon-on-insulator, or silicon-on-sapphire substrate. Alternatively, semiconductor substrate 72 may include structures and layers formed upon a semiconductor substrate. The structures and layers may include, but are not limited to, gate dielectric layers, gate structures, contact structures, local interconnect wires, additional dielectric layers, or metallization layers. In such a case, semiconductor substrate 72 preferably includes an interlevel dielectric layer formed above such layers and structures. In addition, semiconductor substrate 72 may further include an epitaxial layer formed upon the interlevel dielectric such that the substrate may include a silicon-on-insulator (SOI) base on which structures and layers may be formed.

Figure 4B:
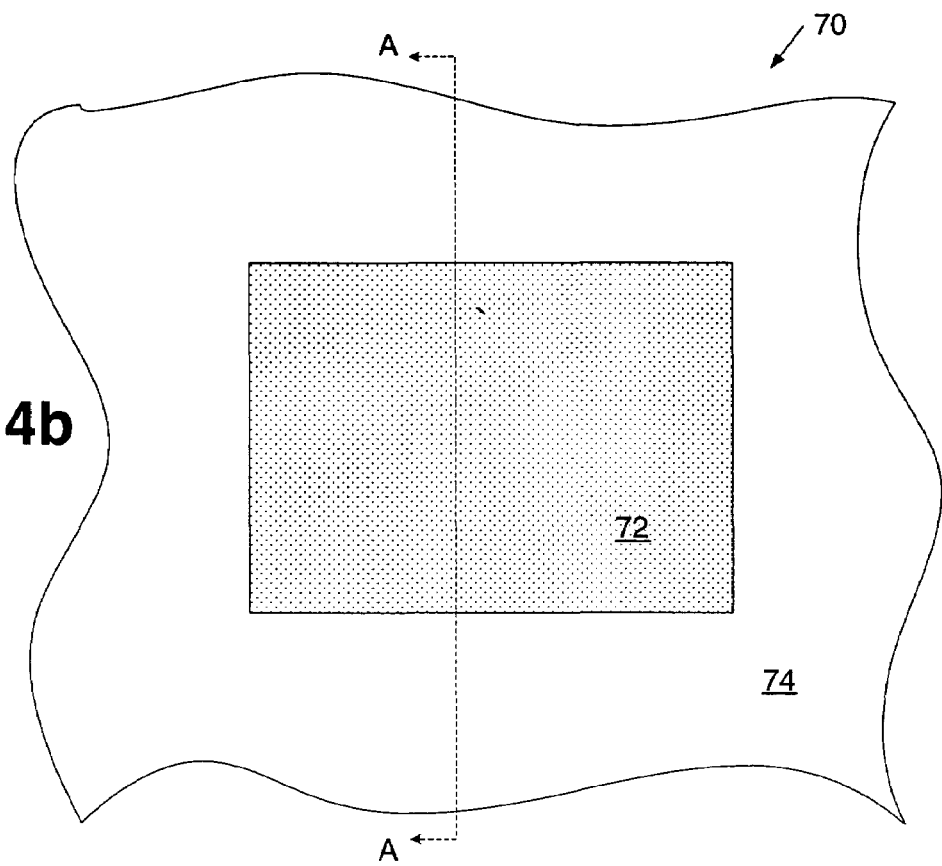

As stated above, semiconductor substrate 72 may include isolation region 74. Such an isolation region may be formed within a semiconductor substrate or within a layer formed upon a substrate. In general, isolation region 74 may be a field oxide region such as a region of undoped silicon dioxide which may serve to isolate separate active regions within semiconductor topography 70. Isolation region 74 may be formed by a number of techniques such as shallow trench isolation (STI), recessed oxide isolation (ROI), or local oxidation of silicon (LOCOS). As shown in FIG. 4b, isolation region 74 maybe formed such that an exposed portion of semiconductor substrate 72 is surrounded by isolation region 74. Alternatively, isolation region 74 may be formed such that an exposed portion of semiconductor substrate 72 is not surrounded in the portion of topography shown in FIG. 4b. It is noted that several shape and layout configurations may be appropriate for isolation region 74, however, depending on the design specifications of the device.

Figure 5A:
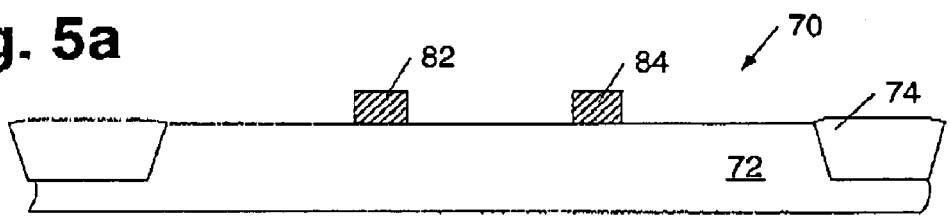
FIG. 5a depicts a partial cross-sectional view of the semiconductor topography of FIG. 4a in which gate structures have been formed upon the semiconductor substrate.
Figure 5B:
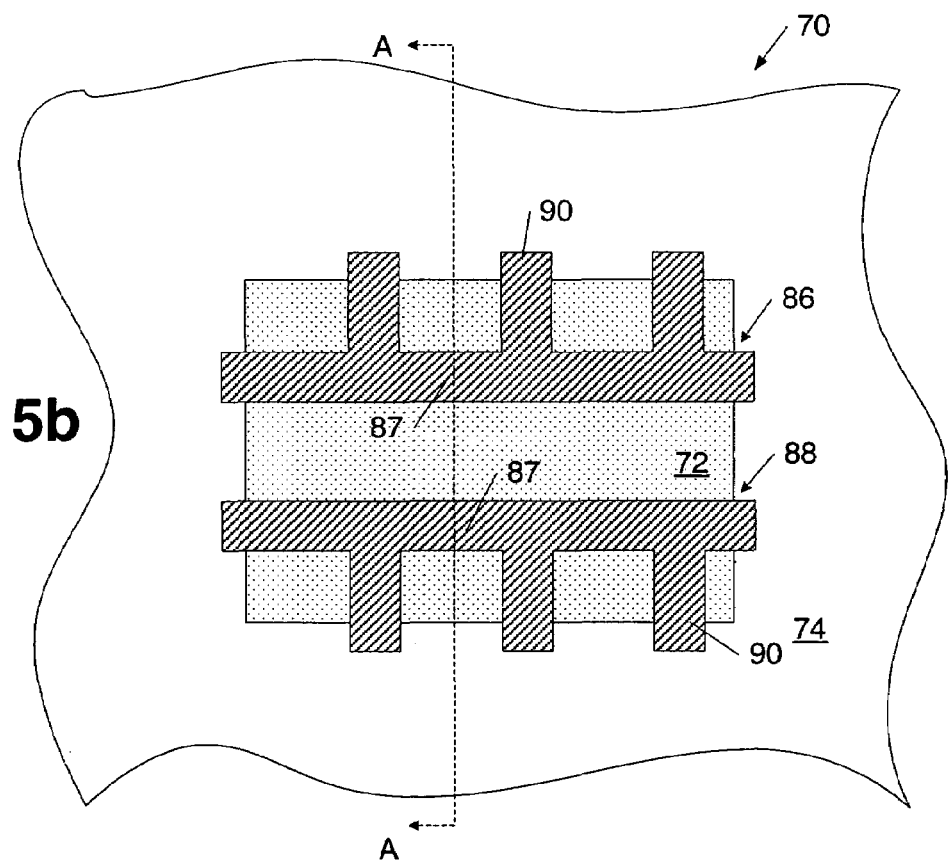

Subsequent to the formation of isolation region 74, gate structures 82 and 84 may be formed upon exposed portions of semiconductor substrate 72 as shown in FIG. 5a. Such gate structures may be formed by depositing or growing a gate dielectric material upon semiconductor topography 70, followed by the deposition of a conductive material. Subsequently, the conductive material may be patterned to form gate structures 82 and 84. A top view of semiconductor topography 70 subsequent to the formation of gate structures 82 and 84 is shown in FIG. 5b. In particular, FIG. 5b illustrates gate structures 82 and 84 as part of word lines 86 and 88, respectively. As shown in FIG. 5b, word lines 86 and 88 may be contiguous conductive structures. In particular, word lines 86 and 88 may include base portions 87 extending above exposed portions of semiconductor substrate 72. In addition, word lines 86 and 88 may include supplementary portions 90 extending from base portions 87 and overlying portions of isolation region 74.

Although FIG. 5b illustrates word lines 86 and 88 with three supplementary portions extending from base portions 87, word lines 86 and 88 may include any number of supplementary portions, depending on the design specifications of the device. For example, in some cases, the number of supplementary portions extending from base portions 87 may depend on the number of memory cells in which word lines 86 and 88 are included. Furthermore, although FIG. 5b illustrates supplementary portions 90 arranged at a right angle relative to base portions 87, supplementary portions 90 may be arranged at any angle relative to base portions 87. In yet other embodiments, one or more of supplementary portions 90 may be omitted from word lines 86 and/or 88. In such an embodiment, the pattern of isolation region 74 is preferably modified from the pattern shown in FIGS. 4b and 5b such that isolation regions may be used to define the widths of the transistors along word lines 86 and 88 as described below in reference to arrays with conventional configurations.

In addition to the pattern layout of word lines 86 and 88, the alignment of word lines 86 and 88 relative to isolation region 74 is distinct from conventional arrays. In particular, a conventional memory circuit generally aligns word lines between elongated portions of isolation regions such that transistors on different word lines are isolated from each other. In this manner, the word lines are each arranged above a plurality of exposed regions of the substrate. The memory circuit described herein, however, allows two word lines to be formed above a single exposed region of the topography. In other words, the memory circuit described herein allows a different pattern of isolation regions to be fabricated across a semiconductor topography.

Figure 6A:
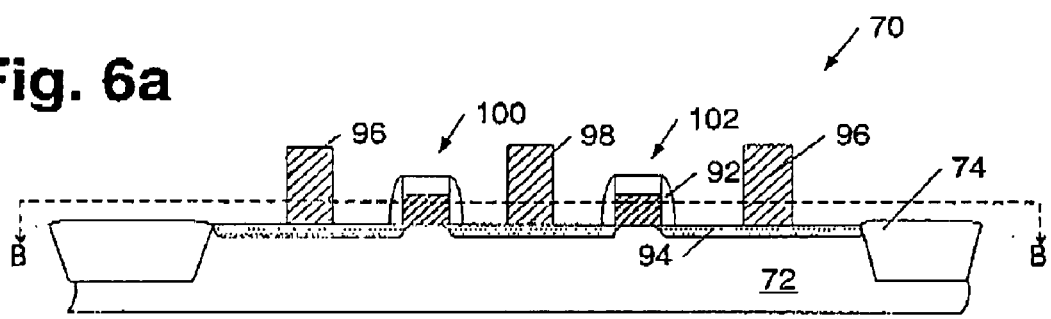
Figure 6B:
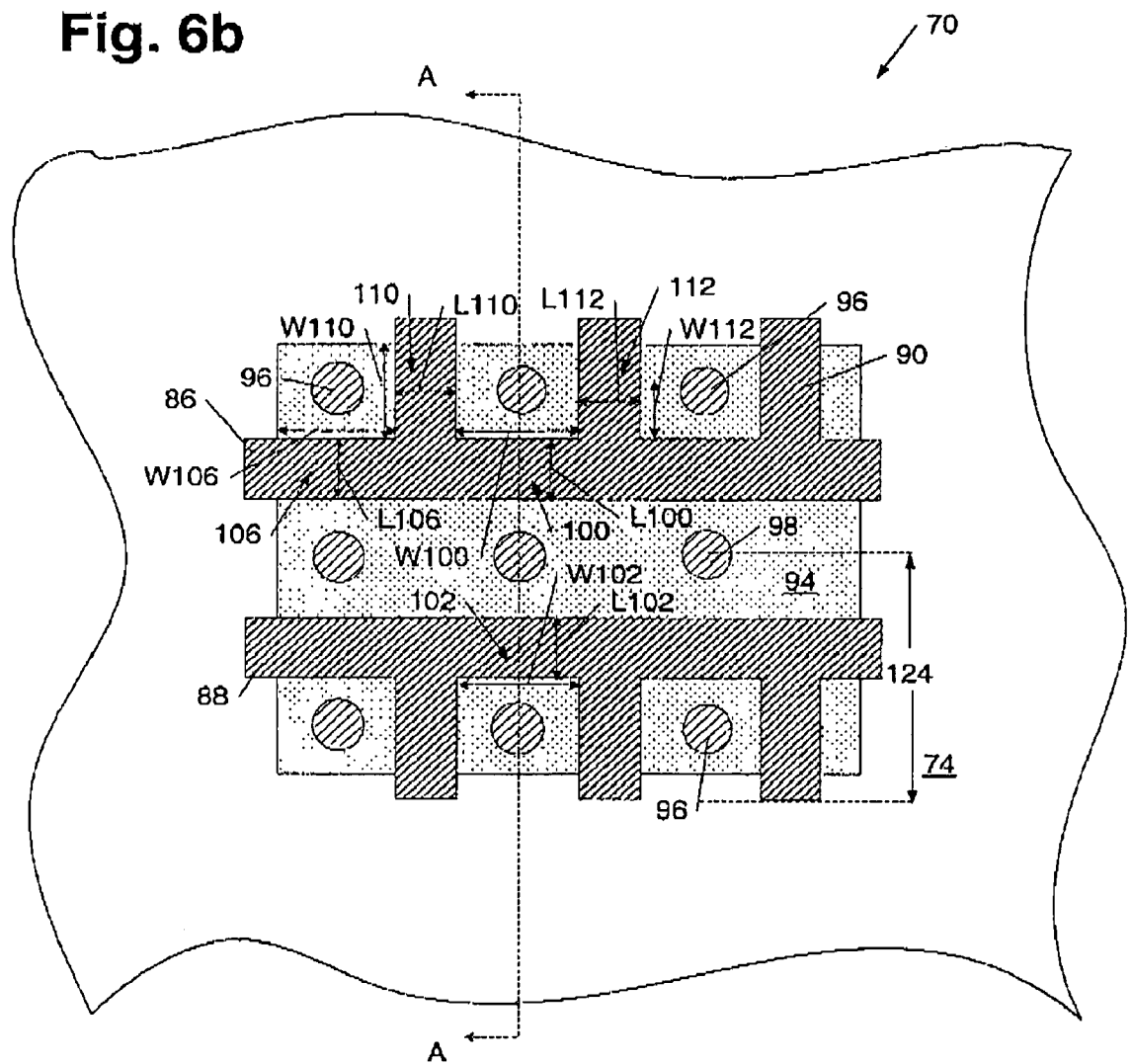
FIG. 6b depicts a top view of the semiconductor topography depicted in FIG. 6a taken along line BB.

FIG. 6a illustrates semiconductor topography 70 subsequent to the formation of dielectric spacer 92 upon the upper surface and sidewalls of gate structures 82 and 84. In addition, FIG. 6a illustrates the formation of diffusion regions 94 and contact structures 96 and 98 formed in contact with diffusion regions 94. Such a fabrication of components forms select transistors 100 and 102 upon semiconductor topography 70. For simplicity, the top view of such a topography is taken along BB of FIG. 6a and is illustrated in FIG. 6b. In particular, FIG. 6b illustrates diffusion regions 94 formed within exposed regions of semiconductor substrate 72 aligned to word lines 86 and 88. In addition, FIG. 6b illustrates contact structures 96 and 98 above diffusion regions 94 and spaced adjacent to word lines 86 and 88.

In general, the length of transistors may be defined by the channel length within the substrate upon which the gate structure of the transistor is formed. In turn, channel length may be defined by the lateral distance between the diffusion regions aligned with the sides of the gate structure of the transistor. As such, the lengths of select transistors 100 and 102 in FIG. 6a may be defined by the regions between diffusion regions 94 under gate structures 82 and 84, respectively. Since diffusion regions 94 are fabricated to be self-aligned to the sidewalls of gate structures 82 and 84, the lengths of select transistors 100 and 102 may generally be defined as the dimension of gate structures 82 and 84 extending between diffusion regions 94. Accordingly, FIG. 6b illustrates the lengths of select transistors 100 and 102 as reference numbers L100 and L102, respectively.

Generally, the width of a transistor may be perpendicular to the length of the transistor. Consequently, the widths of select transistors 100 and 102 are not depicted in FIG. 6a. Rather, the width of select transistors 100 and 102 are defined by the dimension of gate structures 82 and 84 which extend in an orthogonal direction with respect to the cross-sectional view of FIG. 6a. In conventional transistor configurations, such a dimension of a gate structure is characterized by the distance between isolation regions of the device. The magnetic memory array configuration described herein, however, may sometimes include auxiliary transistors (e.g., equilibrium and/or isolation transistors) in place of the isolation structures. As such, the width of a transistor may sometimes be referred to as the dimension of a gate structure which is aligned with an adjacent diffusion region bound between auxiliary transistors of the device. In other embodiments, the width of a transistor may be referred to as the dimension of the gate structure which is aligned with an adjacent diffusion region bound between an isolation structure and an auxiliary transistor.

As such, the width of a transistor, as used herein, may be generally defined as the dimension of a gate structure which is aligned with an adjacent diffusion region and which is bound by the lateral distance of the aligned diffusion region. Preferably, such a diffusion region is arranged along the side of the word line which includes supplementary portions extending from its base portion. In this manner, the width of a transistor, as used herein, may be substantially equal to the lateral distance of a diffusion region extending between supplementary portions of the word line or between an isolation region and a supplementary portion of the word line. For example, width W100 of select transistor 100 may be substantially equal to the lateral distance of the portion of diffusion region 94 arranged between two of supplementary portions 90 as shown in FIG. 6b. Width W102 of select transistor 102 may be similarly described in reference to word line 88. Consequently, the widths of select transistors 100 and 102 may depend on the spacing of supplementary portions 90, in some embodiments. As a result, the word line configuration depicted in FIG. 6b may generally eliminate the transistor width variation among select transistors aligned along a row of the memory array. In particular, since auxiliary transistors are used to isolate select transistors within word lines 86 and 88 rather than conventional isolation structures, concerns regarding the misalignment of the isolation structures become mute.

In addition to select transistors 100 and 102, word lines 86 and 88 may be used to form additional select transistors within semiconductor topography 70. For example, word line 86 may be used to form select transistor 106 along the base portion of word line 86 as shown in FIG. 6b. Since select transistor 106 is formed along the same dimension of word line 86, the width and length of select transistor 106 may be aligned along the same directions as width W100 and L100 of select transistor 100. However, the description of width W106 of select transistor 106 may differ slightly from the description of width W100. In particular, width W106, may be substantially equal to the lateral distance of the portion of diffusion region 94 arranged between one of supplementary portions 90 and a portion of isolation region 74.

In addition, word line 86 may further be adapted to form transistors arranged along a different direction of word line 86. For example, word line 86 may further be adapted to form auxiliary transistors 110 and 112 along segments 90. In this manner, word line 86 may include a first set of transistors aligned along one dimension and a second set of transistors aligned along a different dimension. More specifically, word line 86 may include a first set of one or more transistors including widths arranged along one direction of a semiconductor topography and a second set of one or more transistors including widths arranged along different direction of the semiconductor topography. For example, as shown in FIG. 6b, auxiliary transistors 110 and 112 may be arranged perpendicular to select transistors 100 and 106. In this manner, the lengths (L110 and L112) and widths (W110 and W112) of auxiliary transistors 110 and 112 may be perpendicular to the lengths L100 and L106 and widths W100 and W106.

Furthermore, the configuration of the transistors within word line 86 allows transistors arranged along one direction to be laterally spaced by a transistor arranged along the other direction. For example, select transistor 106 may be laterally spaced from transistor select 100 by the length of auxiliary transistor 110. Moreover, word lines 86 and 88 comprise transistors which share common diffusion regions. For example, word line 86 includes select transistor 100 and auxiliary transistor 112 which shares a common portion of diffusion region 94. In addition, word line 88 includes auxiliary transistor 110 which further shares the common portion of diffusion region 94 between select transistor 100 and auxiliary transistor 112. In some embodiments, a word line may include four or more transistors which share a common portion of a diffusion region. An exemplary word line having such a configuration illustrated in FIG. 8b and described in more detail below.

It is noted that although FIG. 6b only illustrates the formation of six transistors within each of word lines 86 and 88, word lines 86 and 88 may be fabricated to include any number of transistors, depending on the design specifications of the device. Furthermore, word lines 86 and 88 may be configured to extend across an entire row of a memory cell array. In yet other embodiments, word lines 86 and 88 may extend along only a portion of a row of a memory cell array. In either case, the memory cell array may further include a source line with which to selectively supply voltage to gates of one or more transistors arranged within word lines 86 and 88. For example, the memory array may include one or more source lines similar to source line 30 as described in reference to FIG. 1. In addition, the memory array may include any additional components, such as control lines 34 and/or selection device 45a, as described in reference to FIG. 1. Alternatively, the memory cell array may not include such a source line.

In some embodiments, auxiliary transistor 110 or 112 may serve as an equalizing transistor of a magnetic memory cell array. In particular, auxiliary transistor 110 or 112 may serve to reduce or equalize the parasitic resistance variations of the transistors formed from base portion 87 of word line 86. For example, in an embodiment in which select transistors 100 and 106 are formed as a differential memory cell, auxiliary transistor 110 may serve to reduce or equalize the parasitic resistance variations resulting from variations within select transistors 100 and 106. As a result, the affect of the parasitic resistance variation upon the differential resistance of the magnetic junctions may be minimized, allowing the differential resistance measurement to be larger. Consequently, the differential resistance measurement of the memory cell may more accurately represent the resistance of the logic states of the magnetic cell junctions. In some embodiments, however, auxiliary transistor 110 may be omitted from semiconductor topography 70. In such an embodiment, isolation region 74 may be formed such that an isolation structure is formed in the place of auxiliary transistor 110.

In addition or alternatively, auxiliary transistor 110 may serve as an isolation transistor of a magnetic memory cell array. In particular, auxiliary transistor 110 may serve to isolate adjacent transistors formed from base portion 87 of word line 86. In this manner, memory cells arranged along a row of a magnetic memory array may be isolated from each other. For example, auxiliary transistor 110 may isolate select transistors 100 and 106. In such an embodiment, select transistors 100 and 106 may be included in a single cell memory array. In some cases, auxiliary transistor 112 may additionally or alternatively serve as an isolation transistor. In particular, auxiliary transistor 112 may serve as an isolation transistor when auxiliary transistor 110 serves as an equalizing transistor, isolation transistor, or is omitted from semiconductor topography 70. For example, in an embodiment in which select transistors 100 and 106 are included in a differential memory cell, auxiliary transistor 112 may serve to isolate such a differential cell and an adjacent differential memory cell. In other embodiments, auxiliary transistor 112 may serve to isolate single cell memory cells. In yet other cases, auxiliary transistor 112 may be omitted from semiconductor topography 70. In such an embodiment, isolation region 74 may be formed such that an isolation structure is formed in the place of auxiliary transistor 112.

In conventional circuits, isolation between memory cells typically includes isolation structures with relatively large widths such that adequate isolation may be provided. Such relatively large widths restrict the width of adjacent transistors, thereby increasing the parasitic resistance of the transistors. Auxiliary transistors 110 and 112, however, have narrower widths than conventional isolation structures. Consequently, select transistors 100 and 106 may be fabricated with substantially greater widths than select transistors of conventional magnetic memory array circuits. In particular, select transistors 100 and 106 may be fabricated with greater widths without sacrificing the number of the cells arranged within an array. In this manner, the parasitic resistance of select transistors 100 and 106 may be lower, thereby providing a larger signal by which the bit stored within overlying magnetic cell junctions may be determined without reducing the size of the array. In addition or alternatively, the inclusion of one or more isolation transistors within a memory array may decrease the size of the memory array. For example, the length along one direction of a memory array that includes one or more isolation transistors may be reduced by up to 40% in some cases. Such a reduction may be compared to arrays with conventional structure and layer arrangements having similar critical dimensions.

Figure 7:
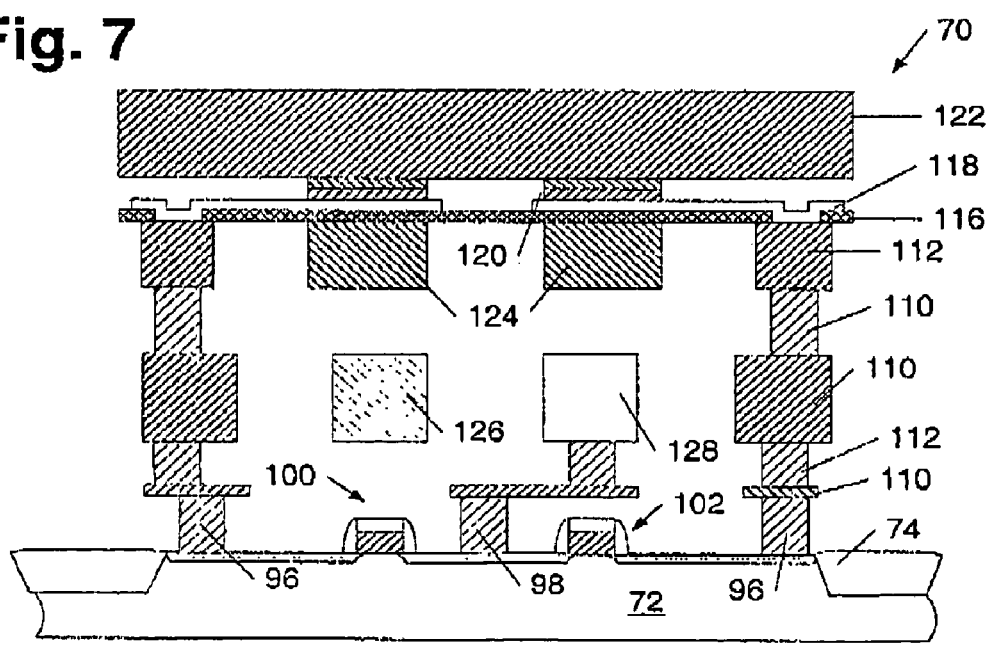

FIG. 7 illustrates semiconductor topography 70 subsequent to further processing. In particular, FIG. 7 illustrates a partial cross-sectional view of a magnetic memory cell array. Such a fabrication process may include the formation of interconnects 110, vias 113, and contacts 114 within semiconductor topography 70. In addition, semiconductor topography 70 may be processed to include source line 126, which is adapted to selectively supply voltage to gates of one or more word lines within a plurality of memory array rows. The function of source line 126 may be similar to conductive lines 30 and 60 in FIGS. 1 and 3. Therefore, a description of the composition and function of such a line may be referenced in the discussion of FIGS. 1 and 3.

In addition, FIG. 7 illustrates the formation of ground line 128 adjacent to source line 126. In conventional arrays, a ground line is typically arranged above contact 98. However, the memory circuit described herein differs from such a conventional configuration by laterally shifting the ground line such that there is room to arrange a source line within the array. For example, FIG. 7 illustrates ground line 128 arranged above select transistor 102 and source line 126 arranged above select transistor 100. It is noted that ground line 128 and source line 126 may alternatively be arranged in other configurations such that there is sufficient spacing between the lines and any adjacent conductive structures. Therefore, the configuration of ground line 128 and source line 126 is not restricted to be in alignment with select transistors 102 and 100 as shown in FIG. 7. In any case, the configuration of shifting ground line 128 from above contact 98 may allow the RC time constant of a word line with the memory circuit provided herein to be lower than word lines of conventional arrays without increasing the size of the array.

Above digit lines 124, dielectric spacer 116 and electrodes 118 may be formed such that magnetic cell junctions 120 may be electrically coupled to underlying structures. In addition, bit line 122 may be formed above magnetic cell junctions 120. As noted in the discussion of FIGS. 1 and 3, bit lines may be used to read and write to magnetic cell junctions, while digit lines may be used to write to magnetic cell junctions. As such, a description of the functions of digit lines 124, bit line 122, magnetic cell junctions 120 may be referenced in the discussion of FIGS. 1 and 3. It is noted that the aforementioned arrangement of components within semiconductor topography 70 is exemplary and, therefore, the configuration of the memory array described herein is not restricted to the arrangement illustated in FIG. 7. In fact, other word line configurations may be used in the memory array circuit provided herein as described in more detail below in reference to FIGS. 5a–9.

FIG. 8a illustrates a partial cross-sectional view of a semiconductor topography having an alternative configuration for the device described herein. In particular, FIG. 8a illustrates semiconductor topography 130 including select transistors 142 and 144 and auxiliary transistors 140 and 146 arranged upon semiconductor substrate 72 and interposed between contact structures 96 and 98. In addition, semiconductor topography 130 may include diffusion regions 134 between the gate structures of the transistors. Preferably, the composition of semiconductor substrate 72 may be substantially similar to semiconductor substrate 72 described in reference to FIG. 4*a*. In addition, the function and composition of contact structures 96 and 98 may be substantially similar to contact structures 96 and 98 of FIG. 6*a*. Consequently, contact structure 98 may serve as a ground line contact in some embodiments. Furthermore, contact structures 96 may serve as interconnect vias between overlying magnetic junctions and transistors 140 and 142 and transistors 144 and 146, respectively, in some embodiments.

The fabrication of semiconductor topography 130 may differ, however, from the fabrication of semiconductor topography 70 as discussed in reference to FIGS. 4*a*-7. In particular, the fabrication of semiconductor topography 130 may form isolation regions surrounding the memory array of the topography in a different pattern layout configuration than formed in FIG. 4*a*. As shown in FIG. 8*b*, isolation regions 74 may be fabricated within semiconductor topography 130 such that contiguous word lines 136–139 may extend over a single exposed region of semiconductor substrate 72. FIG. 8*b* illustrates a top view of semiconductor topography taken along BB of FIG. 8*a*. The partial cross-sectional view of semiconductor topography 30 in FIG. 8*a*, however, is taken along line AA of FIG. 8*b* and, therefore, isolation regions 74 are not depicted in the cross-sectional view. Instead, the word lines of semiconductor topography 130 are configured such that auxiliary transistors 140 and 146 serve as isolation transistors for select transistors 142 and 144, respectively. In this manner, semiconductor topography 130 illustrates a way in which to isolate select transistors along both dimensions of a memory array.

As shown in FIG. 8*b*, the word line comprising transistors 140 and 142 may further include transistors 141, 143, 145, and 147. In general, the function of auxiliary transistor 141 may be similar to that of auxiliary transistor 142. In particular, auxiliary transistor 141 may serve to isolate select transistor 147 from the word line comprising transistors 144 and 146. On the other hand, the function of auxiliary transistors 143 and 145 may be similar to that of auxiliary transistors 110 and 112, respectively, as described in reference to FIG. 6*b*. In particular, auxiliary transistor 143 may be adapted to reduce the parasitic resistance variation between select transistors 147 and 140 when such transistors are included within a differential memory cell. Alternatively, auxiliary transistor 143 may be adapted to isolate select transistor 147 from select transistor 140, particularly when such transistors are included within a single memory cell array configuration. In either case, auxiliary transistor 145 may be adapted to isolate memory cells of semiconductor topography 130. In yet an alternative embodiment, the function of transistors 143 and 145 may be reversed.

In either case, however, the word line configuration illustrated in FIG. 8*b* may be adapted to isolate memory cells of semiconductor topography 130 along both the rows and columns of the memory cell array without the use of conventional isolation structures as described in reference to FIG. 4*a*. In particular, word lines 136–139 maybe configured to have four transistors sharing a common diffusion region. For example, word line 138 includes select transistor 140 and auxiliary transistors 142, 143, and 145 which share a common portion of diffusion region 134. As a result, the word line configuration depicted in FIG. 8*b* may generally eliminate the concerns regarding the misalignment of word lines along columns of the memory array. In particular, since auxiliary transistors within the word lines are used to separate the word lines from each other, concerns regarding the misalignment of the word lines along the direction aligned with the columns of the memory array become mute. In addition, since auxiliary transistors are used to isolate the select transistors within the word lines rather than conventional isolation structures, concerns regarding the misalignment of the isolation structures become mute. In this manner, width variations of select transistors arranged along a row of a memory array may be eliminated. Consequently, the placement of word lines 136–139 may be shifted from their intended locations along the row of the array without changing the characteristics of the transistors arranged within the word lines.

Another benefit of the word line configuration shown in FIG. 8*b* is that the lateral surface area occupied by a memory cell having such a word line may be reduced in at least one direction. In particular, the spacing between word lines of semiconductor topography 130 may be narrower than the spacing between word lines of memory cell array having a configuration similar to that of semiconductor topography 70 of FIG. 6*b*, for example. More specifically, diffusion regions 134 between the words line of semiconductor topography 130 may be fabricated with smaller widths than the widths of isolation structures 74 in semiconductor topography 70. In turn, the lateral dimension of the memory cell aligned with the column of the array may be reduced. For example, a memory cell of semiconductor topography 130 may have lateral dimension 148 extending between memory cells within a column of an array which is approximately 15% smaller than lateral dimension 124 of semiconductor topography 70 in FIG. 6*b*. Such a reduction may be compared to arrays with conventional structure and layer arrangements having similar critical dimensions.

In some cases, the reduction of the lateral surface area occupied by a memory cell having the word line configuration shown in FIG. 8*b* may be further realized by not having contact structures aligned with each of the transistors of the word lines. In particular, the portion of diffusion region 134 interposed between word lines 136 and 137 may include a number of contact structures which is less than the number of corresponding pairs of transistors within such word lines. For example, the portion of diffusion region 134 interposed between the word lines 136 and 137 is shown to only include contact structure 135. The portion of diffusion region 134 between word lines 138 and 139 is also shown to include a single contact structure. Such a configuration may advantageously reduce the spacing of the portion of diffusion region 134 such that the lateral surface area of the memory cells of the array may be reduced.

In yet other embodiments, however, the portion of diffusion region 134 interposed between the word lines 136 and 137 and word lines 138 and 139 may include a contact structure for each pair of opposing transistors within the adjacent word lines. Such a configuration may not realize the benefits of further reducing the lateral surface area of the memory cell along the direction aligned with the columns of the array as with a memory array which includes fewer contact structures than the number of opposing transistors within the adjacent word lines. However, a configuration having a contact structure for each pair of opposing transistors within the adjacent word lines may minimize the resistance of the transistors within the word line such that RC time constant of the word line is reduced. Therefore, the number of contacts arranged within portions of the diffusion regions between word lines of the memory cell array may depend on the design characteristics of the device. In particular, the number of contacts arranged within portions of the diffusion regions between word lines of the memory cell array may be optimized such that the RC time constant may be minimized while the density of the memory array may be maximized.

In any case, the density of an array with a word line configuration depicted in FIG. 8*b* may be increased relative to an array with a word line configuration illustrated in FIG. 6*b*. Alternatively, select transistors 142 and 144 and auxiliary transistors 140 and 146 may be fabricated with substantially greater lengths than select transistors 100 and 102 of FIG. 6*b*. In particular, select transistors 142 and 144 and auxiliary transistors 140 and 146 may be fabricated with greater lengths relative to the select transistors of semiconductor topography 70 without sacrificing the number of the cells arranged within an array. In this manner, the parasitic resistance of select transistors 142 and 144 and auxiliary transistors 140 and 146 may be lower, thereby providing a larger signal by which the bit stored within overlying magnetic cell junctions may be determined without reducing the size of the array.

It is noted that although FIG. 8*b* only illustrates the formation of twelve transistors within each of word lines 136–139, word lines 136–139 may be fabricated to include any number of transistors, depending on the design specifications of the device. Furthermore, word lines 136–139 may be configured to extend across an entire row of a memory cell array or, alternatively, along only a portion of a row of a memory cell array. In either case, the memory cell array may further include a source line with which to selectively supply voltage to gates of one or more transistors arranged within word lines 136–139. In addition, the memory array may include any additional components, such as control lines 34 and/or a selection device, coupled to the source line. Alternatively, the memory cell array may not include such a source line. Returning to FIG. 8*a*, semiconductor topography 130 may be further processed to form a magnetic memory cell array in a manner similar to that of the fabrication of the magnetic memory cell array of semiconductor topography 70 in FIG. 7. In particular, semiconductor topography 130 may be further processed to form a ground line contact, interconnect vias, contact structures, a source line which is adapted to selectively supply voltage to gates of one or more word lines within the memory cell array, digit lines, dielectric spacers, electrodes, magnetic cell junctions, and bit lines.

Figure 9:
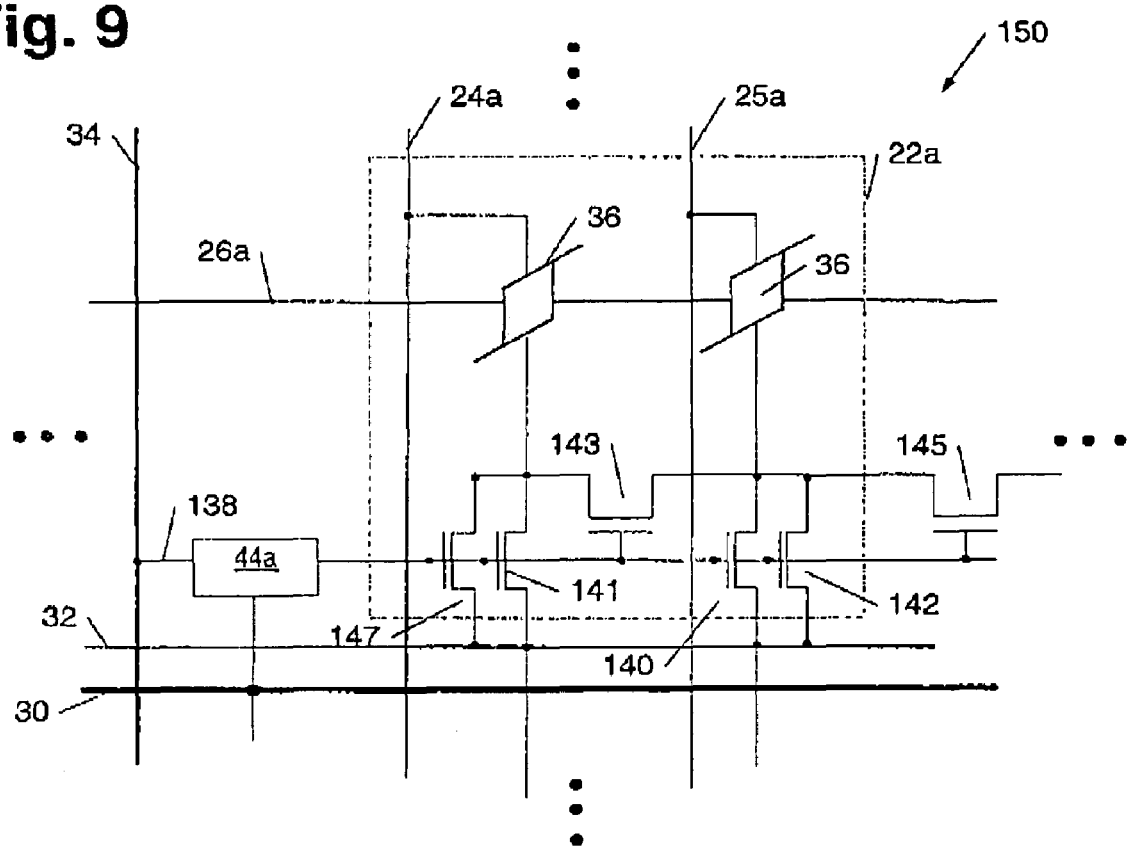
FIG. 9 depicts an electrical schematic diagram of a magnetic memory cell array having a word line configuration depicted in FIG. 8b.

An electrical schematic diagram of a memory cell array having the word line configuration depicted in FIG. 8*b* is illustrated in FIG. 9. In particular, FIG. 9 illustrates a partial electrical schematic diagram of memory cell array 150 depicting the arrangement of transistors within a differential memory cell of the array corresponding to word line 138 of FIG. 8*b*. In addition, FIG. 9 illustrates memory cell array including bit line 24*a*, bit line bar 25*a*, digit line 26*a*, magnetic junctions 36, source line 30, ground line 32, and control lines 34. As with the electrical schematic diagrams of FIGS. 1 and 3, FIG. 9 includes continuation dots along the periphery of the diagram indicating the continuation of memory cells along the rows and columns or the array which are similar to that of memory cell 22*a*. With the exception of word line 138, the components within memory cell array 150 may be similar to the components of FIG. 1 having their respective reference numerals. As such, bit line 24*a*, bit line bar 241, digit line 26*a*, magnetic junctions 36, source line 30, ground line 32, and control lines 34 may serve similar functions as their respective components described in reference to FIG. 1. In general, the word line configuration depicted in FIG. 8*b* may be used within any type of memory cell array. Therefore, the illustration of word line 138 in a differential memory cell array of FIG. 9 does not restrict the use of the word line in such a memory cell array configuration. In particular, the word line configuration depicted in FIG. 8*b* may alternatively be used within single memory cell arrays.

As shown in FIG. 9 and described in reference to FIG. 8*b*, word line 138 may include select transistors 140 and 141 and auxiliary transistors 142, 143, 145, and 147. The arrangement and function of some of the transistors may be similar to that of select transistors 38 and auxiliary transistors 40 and 42 of word line 28*a* in FIG. 1, respectively. In particular, select transistors 140 and 141 may be coupled to magnetic cell junctions 36 such that current may be induced through the junctions. In addition, auxiliary transistor 143 may be coupled between select transistors 141 and 140 such that the parasitic resistance variation between the select transistors may be reduced. Moreover, auxiliary transistor 145 may be coupled between memory cell 22*a* and an adjacent memory cell such that the memory cells may be isolated. As note above, however, word line 138 may further include auxiliary transistors 147 and 142 with which to isolate select transistors 141 and 140 from transistors of adjacent word lines, respectively. Such an arrangement of auxiliary transistors 147 and 142 within memory cell 22*a* may be depicted parallel to select transistors 141 and 140, respectively, as shown in FIG. 9.

Another word line configuration of the memory array described herein is depicted in FIG. 8*c*. In particular, FIG. 8*c* depicts semiconductor topography 130 having an alternative word line configuration than the word line configuration depicted in FIG. 8*b*. More specifically, FIG. 8*c* illustrates semiconductor topography 130 including word lines 150–153 rather than word lines 136–139 as depicted in FIG. 8*b*. As shown in FIG. 8*c*, word lines 150–153 may include select transistors 142 and 144 and auxiliary transistors 140 and 146. In this manner, FIG. 8*a* may be used to illustrate the partial cross-sectional view of FIG. 8*c* taken along line AA. Consequently, FIG. 8*a* may be used to illustrate the partial cross-sectional view of either of the word line configurations depicted in FIGS. 8*b* and 8*c*. Word lines 150–153 of FIG. 8*c* differ, however, from word lines 136–139 of FIG. 8*b*. In particular, word lines 150–153 do not have auxiliary transistors with which to reduce the parasitic resistance variation between select transistors of the word line and/or with which to isolate memory cells arranged along a row of the memory cell array. More specifically, word lines 150–153 do not include auxiliary transistors 143 and 145 as described in reference to FIG. 8*b*. Such a configuration, however, may still reduce the resistance within the memory cell word lines relative to word lines within conventional memory cell configurations.

In particular, the inclusion of auxiliary transistors 140 and 146 may be used to reduce the resistance of the line. In addition, the word line configuration of FIG. 8*c* may advantageously have a lower capacitance relative to the word line configurations of FIGS. 6*b* and 8*b* since the word line comprises less amount of material. Consequently, the RC time constant of the word line configuration depicted in FIG. 8*c* may be lower than the RC time constant of word line configurations depicted in FIGS. 6*b* and 8*b*, as well as in conventional memory cells. As a result, the configuration of the word line configuration in FIG. 8*c* may be used to reduce the operation speed of a memory cell device. In addition, the word line configuration depicted in FIG. 8*c* may generally eliminate the concerns regarding the misalignment of word lines along columns of the memory array, similar to the word line configuration depicted in FIG. 8b. In particular, since auxiliary transistors within the word lines are used to isolate the word lines from each other, concerns regarding the misalignment of the word lines along the direction aligned with the columns of the memory array become mute. Consequently, the placement of word lines 150–153 may be shifted from their intended locations along the column of the array without changing the characteristics of the transistors arranged within the word lines.

It will be appreciated to those skilled in the art having the benefit of this disclosure that this invention is believed to provide a magnetic memory array configuration and a method for making such an array. Further modifications and alternative embodiments of various aspects of the invention will be apparent to those skilled in the art in view of this description. For example, it is noted that the features provided herein are not mutually exclusive. In particular, a memory array may include one or a combination of any of the features described herein. For example, a memory array may include a source line coupled to word lines of the memory array, one or more equalizing transistors, and/or one or more isolation transistors. It is intended that the following claims be interpreted to embrace all such modifications and changes and, accordingly, the specification and drawings are to be regarded in an illustrative rather than a restrictive sense.

What is claimed is:

1. A circuit, comprising:
   a magnetic memory array; and
   a voltage source line arranged between a first row of memory cells of the magnetic memory array and a second row of memory cells of the magnetic memory array, wherein the circuit is adapted to selectively supply voltage from the voltage source line to gates of one or more transistors arranged within the first row of memory cells of and to gates of one or more transistors arranged within the second row memory cells.

2. The circuit of claim 1, wherein the voltage source line is one of a plurality of voltage source lines separately arranged between every other row within the magnetic memory array.

3. The circuit of claim 1, further adapted to selectively supply voltage from the voltage source line to gates of one or more transistors arranged within other rows of the magnetic memory array.

4. The circuit of claim 1, further comprising:
   a first selection device adapted to direct the voltage from the voltage source line to the gates of the one or more transistors within the first row;
   a second selection device adapted to direct the voltage from the voltage source line to the gates or the one or more transistors within the second row; and
   a control line adapted to selectively activate the first selection device and the second selection device.

5. The circuit of claim 4, further comprising a second control line adapted to selectively activate a third selection device of the magnetic memory array to direct another voltage from a different voltage source line to gates of one or more transistors arranged within a third row of the magnetic memory array.

6. The circuit of claim 4, wherein the one or more transistors within the first row comprise a portion of a plurality of transistors arranged along the first row, and wherein the circuit further comprises a third control line adapted to activate a fourth selection device of the magnetic memory array to direct the voltage from the voltage source line to gates of one or more transistors within another portion of the plurality of transistors arranged along the first row.

7. The circuit of claim 1, wherein at least two of the transistors within the first row share a common diffusion region.

8. A magnetic random access memory array comprising a memory cell with a word line having gates of a first transistor, a second transistor, and a third transistor that share a common diffusion region, wherein the gates of the first and second transistors are arranged such that their widths are respectively aligned with a length and a width of the magnetic random access memory array.

9. The magnetic random access memory array of claim 8, wherein the word line further comprises a gate of a fourth transistor that shares the common diffusion region.

10. The magnetic random access memory array of claim 9, wherein the gate of the first transistor is laterally spaced from the gate of the second transistor by the common diffusion region.

11. The magnetic random access memory array of claim 8, wherein the word line further comprises a gate of a third transistor laterally spaced from the gate of the first transistor by a length of the gate of the second transistor.

12. The magnetic random access memory array of claim 11, wherein the second transistor is configured to isolate the first and third transistors from each other.

13. The magnetic random access memory array of claim 11, wherein the second transistor is configured to reduce the parasitic resistance variation between the first and third transistors.

14. A magnetic random access memory (MRAM) array, comprising:
   a magnetic cell junction; and
   a plurality of transistors coupled to the magnetic cell junction, wherein the MRAM array is configured to enable current flow along a single current path through the magnetic cell junction and along multiple current paths extending from the single current path to the plurality of transistors.

15. The magnetic random access memory array of claim 14, wherein gates of the plurality of transistors are arranged along a contiguous conductive structure.

16. The magnetic random access memory array of claim 14, wherein the plurality of transistors comprises an equilibrium transistor configured to reduce the parasitic resistance variation between at least two transistors of the plurality of transistors.

17. The magnetic random access memory array of claim 14, wherein the plurality of transistors comprises an isolation transistor configured to isolate memory cells of the magnetic random access memory array.

18. The magnetic random access memory array of claim 14, further adapted to selectively supply voltage from a single source line to gates of the plurality of transistors and to gates or one or more transistors coupled to a different magnetic cell junction which is arranged along a different row of the MRAM array.

* * * * *

UNITED STATES PATENT AND TRADEMARK OFFICE
CERTIFICATE OF CORRECTION

PATENT NO. : 7,095,647 B1
APPLICATION NO. : 10/325008
DATED : August 22, 2006
INVENTOR(S) : Jenne et al.

It is certified that error appears in the above-identified patent and that said Letters Patent is hereby corrected as shown below:

IN THE CLAIMS:

Col. 23, line 52: After the phrase "to the gates," please delete "or" and substitute --of--.

Signed and Sealed this

Seventeenth Day of April, 2007

JON W. DUDAS
*Director of the United States Patent and Trademark Office*